United States Patent
Appaswamy et al.

(10) Patent No.: US 9,711,643 B2
(45) Date of Patent: Jul. 18, 2017

(54) ESD ROBUST MOS DEVICE

(71) Applicant: Texas Instruments Incorporated, Dallas, TX (US)

(72) Inventors: Aravind C. Appaswamy, Dallas, TX (US); Akram A. Salman, Plano, TX (US); Farzan Farbiz, Dallas, TX (US); Gianluca Boselli, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 178 days.

(21) Appl. No.: 14/552,257

(22) Filed: Nov. 24, 2014

(65) Prior Publication Data

US 2015/0146330 A1 May 28, 2015

Related U.S. Application Data (60) Provisional application No. 61/908,295, filed on Nov. 25, 2013, provisional application No. 61/969,524, filed on Mar. 24, 2014.

(51) Int. Cl.
*H01L 27/02* (2006.01)
*H01L 29/78* (2006.01)
*H01L 29/10* (2006.01)

(52) U.S. Cl.
CPC ........ *H01L 29/7835* (2013.01); *H01L 27/027* (2013.01); *H01L 29/1087* (2013.01)

(58) Field of Classification Search
CPC  H01L 29/7835; H01L 27/027; H01L 29/1087
USPC .......................................................... 361/56
See application file for complete search history.

(56) References Cited

U.S. PATENT DOCUMENTS

| | | | | |
|---|---|---|---|---|
| 6,201,427 B1* | 3/2001 | Osborn | ................ | H03K 17/063 327/310 |
| 7,741,680 B2* | 6/2010 | Zhu | ...................... | H01L 27/0255 257/343 |
| 2006/0202265 A1* | 9/2006 | Xu | ...................... | H01L 27/0266 257/335 |
| 2013/0264640 A1 | 10/2013 | Salman et al. | | |
| 2014/0167169 A1* | 6/2014 | He | ...................... | H01L 27/0255 257/355 |
| 2014/0197450 A1* | 7/2014 | He | ...................... | H01L 27/0248 257/133 |

OTHER PUBLICATIONS

Appaswamy, Aravind; Farbiz, Farzan; Salman, Akram.; "Novel Area-Efficient Techniques for Improving ESD Performance of Drain Extended Transistors," International Reliability Physics Symposium (IRPS) 2014, Jun. 1, 2014, 7 pages.

* cited by examiner

*Primary Examiner* — Scott Bauer
(74) *Attorney, Agent, or Firm* — Tuenlap D. Chan; Charles A. Brill; Frank D. Cimino (57) ABSTRACT

A semiconductor device includes a body and a transistor fabricated into the body. Isolation material at least partially encases the body. Biasing is coupled to the isolation material, wherein the biasing is for changing the electric potential of the isolation material in response to an electrostatic discharge event.

6 Claims, 10 Drawing Sheets

ESD ROBUST MOS DEVICE

This application claims priority to the following patent applications: U.S. provisional patent application 61/969,524 of Aravind Appaswamy for A METHOD/TECHNIQUE TO RESTORE ESD ROBUSTNESS IN ISOLATED DEMOS DEVICES, filed on Mar. 24, 2014, which is incorporated for all that is disclosed; and U.S. provisional patent application 61/908,295 of Aravind C. Appaswamy for A NEW ESD ROBUST DMOS DEVICE, filed on Nov. 25, 2013, which is hereby incorporated for all that is disclosed therein.

BACKGROUND

Drain-extended MOS (DEMOS) devices are used extensively in analog circuits as interfaces between low-voltage processing circuitry and high-voltage devices that are located off a chip in which the DEMOS devices are located. The use of DEMOS devices as interface elements often places them in the critical path of electrostatic discharge (ESD). DEMOS devices are well known for having poor drain-to-source ESD current handling capability due to kirk-effect induced voltage snapback. Isolated DEMOS devices are also vulnerable to failures induced by their parasitic transistors coupling them to isolation.

The current ESD protection techniques for DEMOS devices involves either using parallel ESD clamps or relying on self protection. Insertion of parallel ESD clamps typically requires significant area on the chip and may impose limitations on the maximum slew-rate of the output signal during operation. Self protection is not always practical because the gate voltages of the output transistors intrinsic in a DEMOS device cannot be guaranteed to stay on during ESD events. For example, the parasitic paths and circuit loading cause situations where robust self protection can be achieved only by relying on the current handling capability of the transistor in breakdown mode. Self protection in breakdown mode however requires the protected devices being large enough to enable self-protection. For example, self protection of a 2 kV discharge typically requires a total device width greater than 10,000 um and requires the breakdown current (IT1) to scale with the device width and number of gate fingers.

SUMMARY

A semiconductor device includes a body and a transistor fabricated into the body. Isolation material at least partially encases the body. Biasing is coupled to the isolation material, wherein the biasing is for changing the electric potential of the isolation material in response to an electrostatic discharge event.

DETAILED DESCRIPTION

Figure 1:
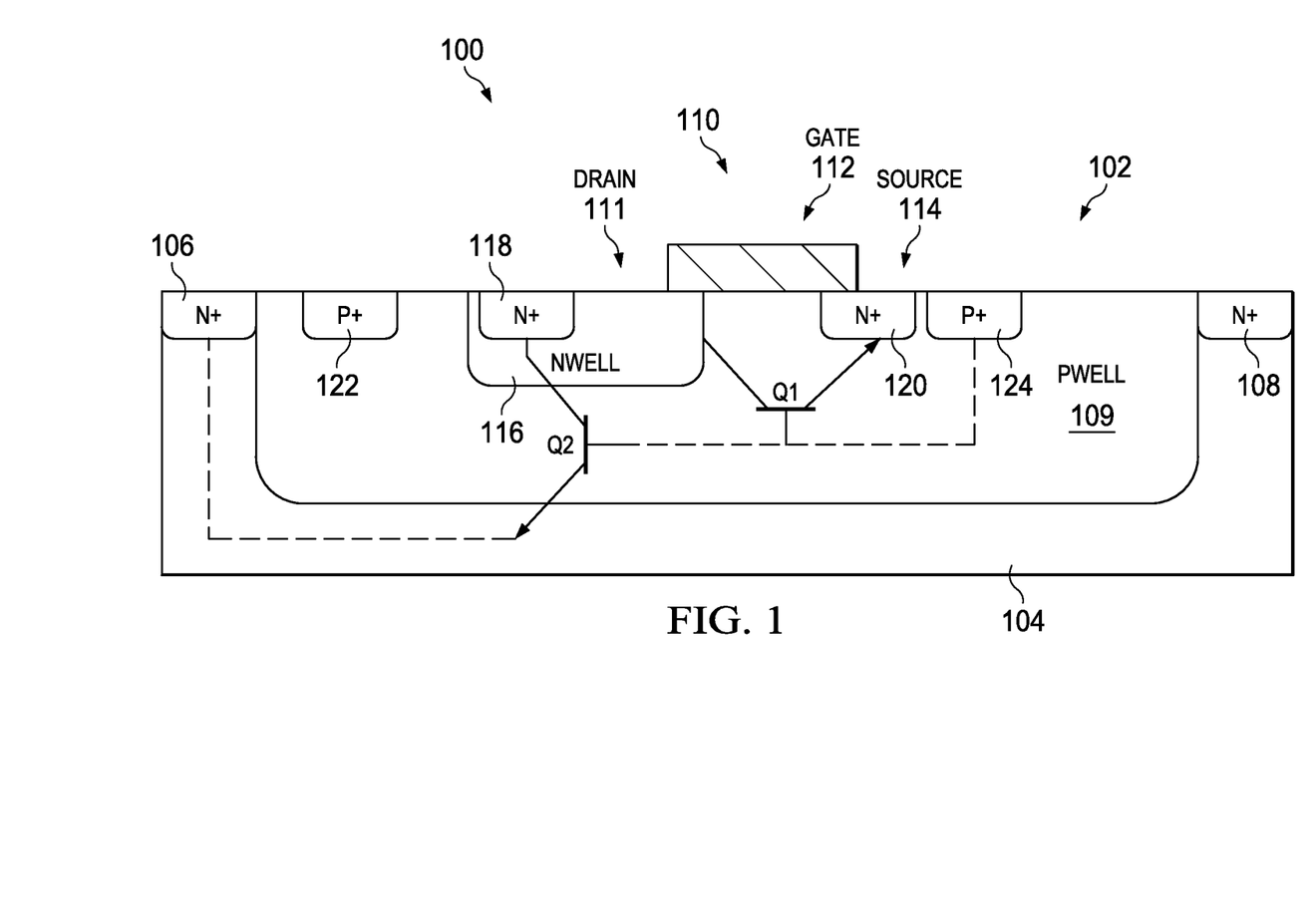
FIG. 1 is a cutaway view of an isolated DEMOS device.

FIG. 1 is a cut away view of an embodiment of a drain extended metal oxide semiconductor (DEMOS) device 100 that includes a semiconductor 102 encased in an isolation material 104. The combination of the semiconductor 102 and the isolation material 104 forms an isolated DEMOS device 100. The isolation material 104 is sometimes referred to as the isolation 104 and at least partially encircles or encases the semiconductor 102. In the example of FIG. 1, the isolation 104 is negatively doped and has two contact regions 106 and 108 shown in the cut away view of FIG. 1 that are both doped N+. Although only two contact regions 106 and 108 are shown in FIG. 1, the isolation 104 may have any number of contact regions located therein.

The semiconductor 102 includes a body 109, which in the example of FIG. 1 is a Pwell. The body 109 or a portion of the body 109 has been fabricated into a transistor 110, which in the example of FIG. 1 is a metal oxide semiconductor field effect transistor (MOSFET) with an extended drain. The semiconductor 102 is sometimes referred to as a drain extended metal oxide semiconductor (DEMOS). The example transistor 110 of FIG. 1 is an NPN transistor that has a drain 111, a gate 112, and a source 114. The drain 111 is an Nwell region 116 with a contact region 118 that is doped N+. The source 114 has a contact region 120 that is doped N+. The gate 112 extends on a top surface of the body 109 and contacts both the Nwell region 116 of the drain 111 and the contact region 120 of the source 114. The body 109 has a first contact region 122 and a second contact region 124 that are both doped P+. In some aspects of the semiconductor 102, the first contact region 122 and the second contact region 124 are a single doped region. In other embodiments, the body 109 has more than two contact regions.

The device 100 forms two parasitic NPN transistors in the body 109 in conjunction with the isolation 104. A first transistor Q1 is formed laterally between the drain 111 and the source 114. A second transistor Q2 is formed vertically between the drain 111 and the isolation 104. Electrostatic discharge (ESD) events cause high current to flow between the drain 111 and the isolation 104, which is between the collector and emitter of the second transistor Q2. These ESD events break down the transistor Q2, which is a breakdown of the body 109, which leads to failure of the device 100. The devices described herein reduce the probability of ESD events causing failure of the transistor Q2. In addition, many of the devices described herein improve scalability of the transistor Q1, wherein the current handling capability of the devices increases with the physical size of the devices.

In many embodiments of MOS devices, the base doping profile of the second transistor Q2 is designed such that it does not enter into breakdown before the first transistor Q1.

This breakdown scheme does not guarantee that the transistor Q2 remains inactive during ESD events. For example, when the collector/base junction of the first transistor Q1 enters into breakdown, the holes generated by impact ionization flow to the nearby P+ body contact regions 122, 124 and raise the local body potential of the second transistor Q2, which allows current flow between the drain 111 and the isolation 104. The isolation 104 is typically configured as a ring around the entire semiconductor 102, which limits the current handling capability of the device 100 due to the limited emitter periphery and varying emitter resistance of the second transistor Q2.

Circuits and methods are described herein that improve the ESD robustness of the device 100. The circuits and methods serve to protect the transistor Q2, and thus the semiconductor 102, during ESD events, which prevent the device 100 from failing as a result of the ESD events. In general, the potential of the isolation 104 is increased or otherwise changed during an ESD event, which prevents the transistor Q2 from conducting and, thus, prevents damage to the body 109. For example, if the potential of the isolation 104 is increased during an ESD event, the emitter voltage of the transistor Q2 rises higher than the voltage of the body 109 or base of the transistor Q2. This increase in emitter voltage relative to the base voltage causes the transistor Q2 to turn off or reduce the collector to emitter current, which is the current through the body 109. Raising the potential of the isolation 104 improves the scalability of the device 100 wherein a larger device 100 is able to withstand greater current resulting from ESD events. For example, the current flow is spread through the device 100, so a larger device can withstand higher currents resulting from the ESD events.

Figure 2:
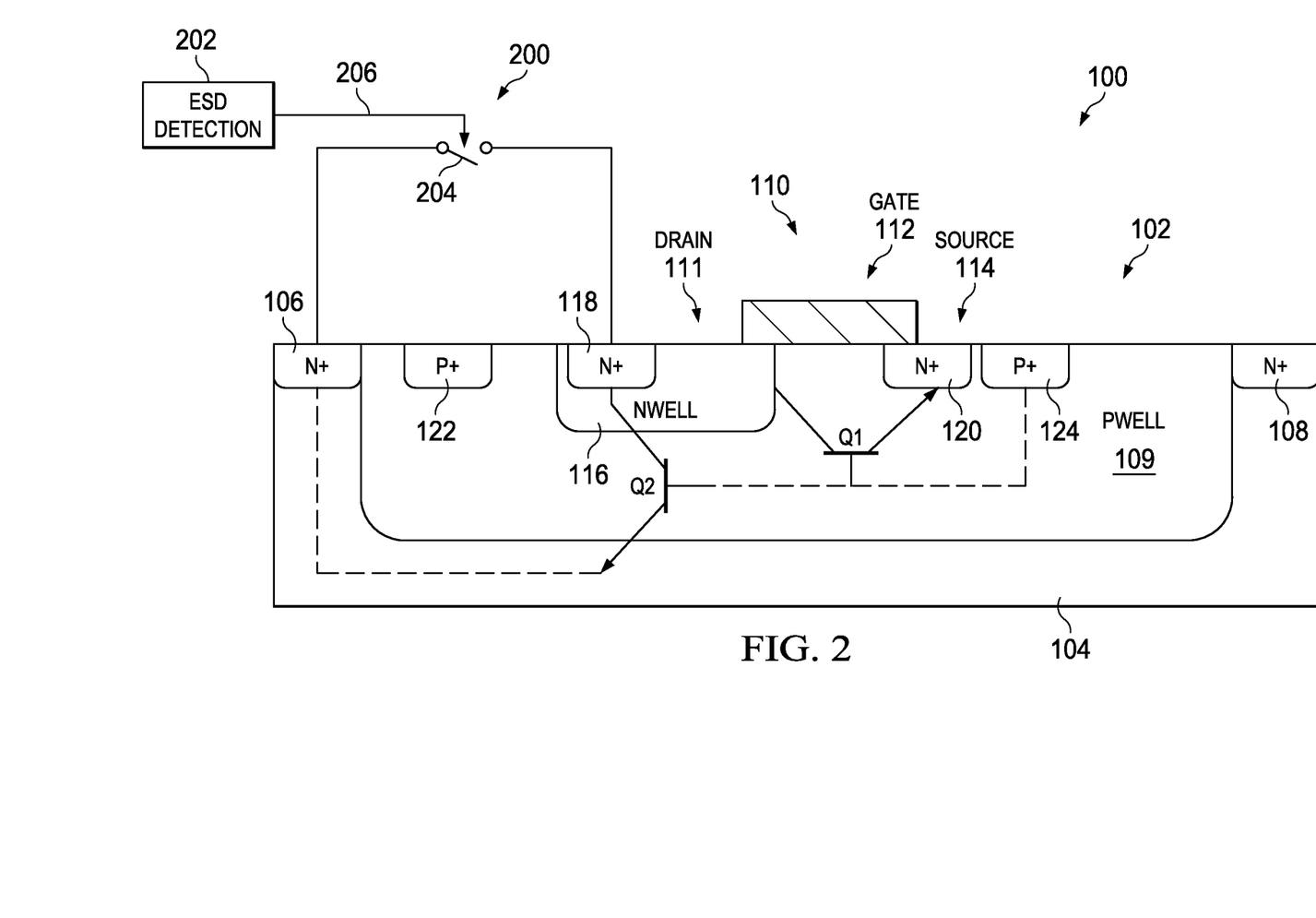
FIG. 2 is a cutaway view of the isolated DEMOS device of FIG. 1, wherein the isolation and drain are coupled together during ESD events.

FIG. 2 is a side cutaway view of the device 100 with a circuit 200 that alleviates the effects of ESD events on the device 100. The circuit 200 includes an ESD detection device 202 that detects ESD events associated with the device 100. A switch 204 is coupled between the isolation 104 and the drain 111. In the example of FIG. 2, the switch 204 is coupled to the contact region 118 of the drain 111. In some examples, the switch 204 is an electronic switch such as a transistor. The ESD detection device 202 has an output 206 wherein a signal is generated at the output 206 when the ESD detection device 202 detects an ESD event. The control of the switch 204 is governed by the signal at the output 206 of the ESD detection device 202. The switch 204 is open during normal operation of the device 100. When the ESD detection device 202 detects an ESD event, the signal generated at the output 206 causes the switch 204 to close. The collector and emitter of the transistor Q2 reach the same potential in response to the switch 204 closing, which prevents or reduces current flow through the body 109. In other words, when the switch 204 closes, the isolation 104 and drain 111 have the same potential, which prevents current flow through the body 109. Without the current flow through the body 109, damage to the body 109 due to the ESD event is prevented.

Figure 3:
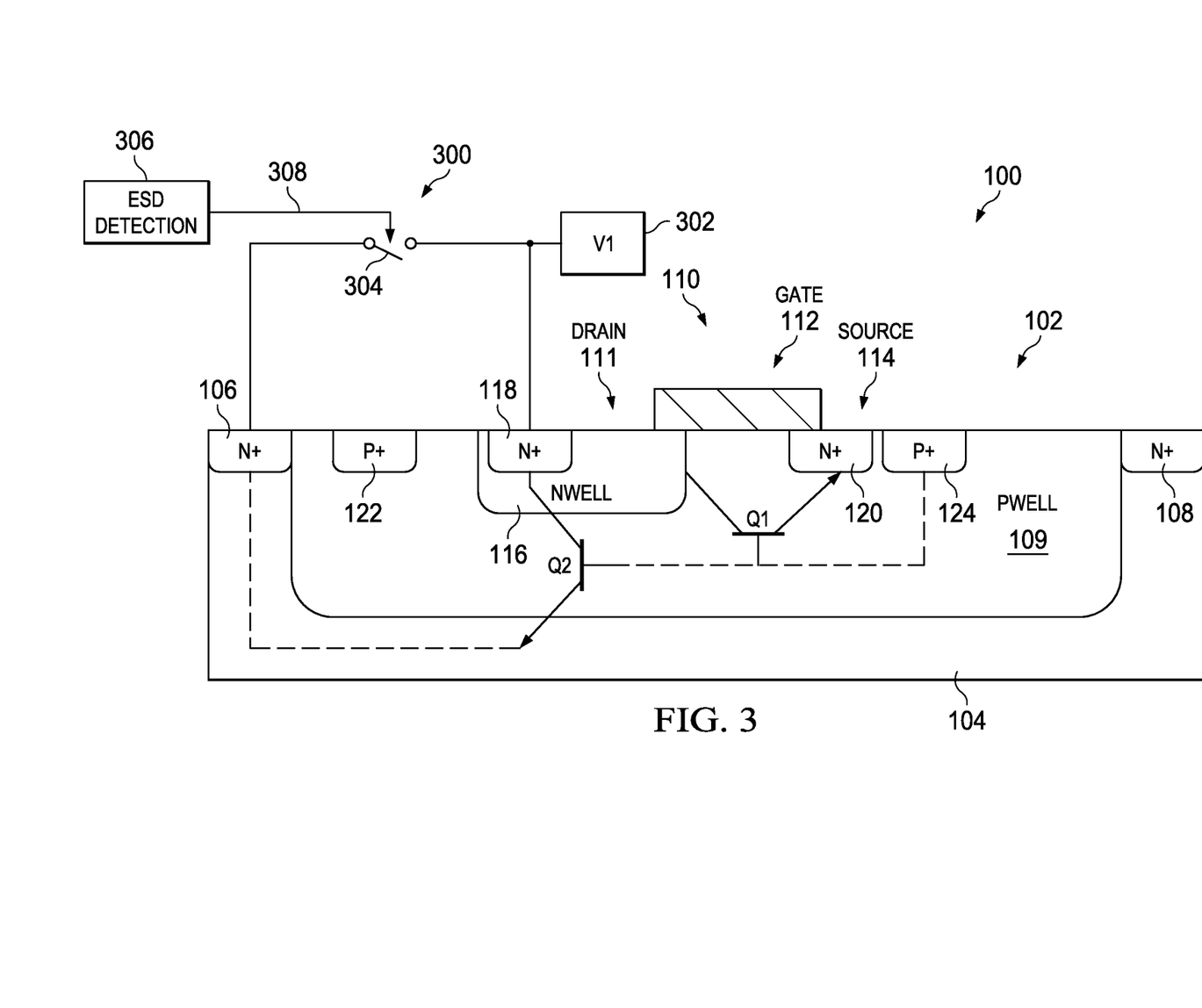
FIG. 3 is a cutaway view of the isolated DEMOS device of FIG. 1, wherein a voltage potential is coupled to the isolation during ESD events.

FIG. 3 is a side cutaway view of the device 100 with another circuit 300 that alleviates the effects of ESD events. The circuit 300 includes a drain bias 302 coupled to the contact region 118 of the drain 111. The drain bias 302 may be a drain bias or it may be representative of a bias applied to the contact region 118. The drain 111 is coupled to the isolation 104 by way of a switch 304. In some examples, the switch 304 is the same type of switch as the switch 204 of FIG. 2. The circuit 300 includes an ESD detection device 306 that has an output 308. The ESD detection device 306 generates a signal at the output 308 when it detects an ESD event. The switch 304, which is normally open, closes in response to the signal generated at the output 308 of the ESD detection device 306. When the switch 304 is closed, the drain 111 is coupled to the isolation 104, which raises or changes the potential of the isolation 104 to a voltage V1, which is the voltage of the drain bias 302. When the potential of the isolation 104 is raised or changed to the voltage V1, the current flow through the body 109 is reduced, which reduces the possibility of damage due to the ESD event. More specifically, the potential between the drain 111 and the body 109 is reduced when the drain 111 is coupled to the isolation 104.

Figure 4:
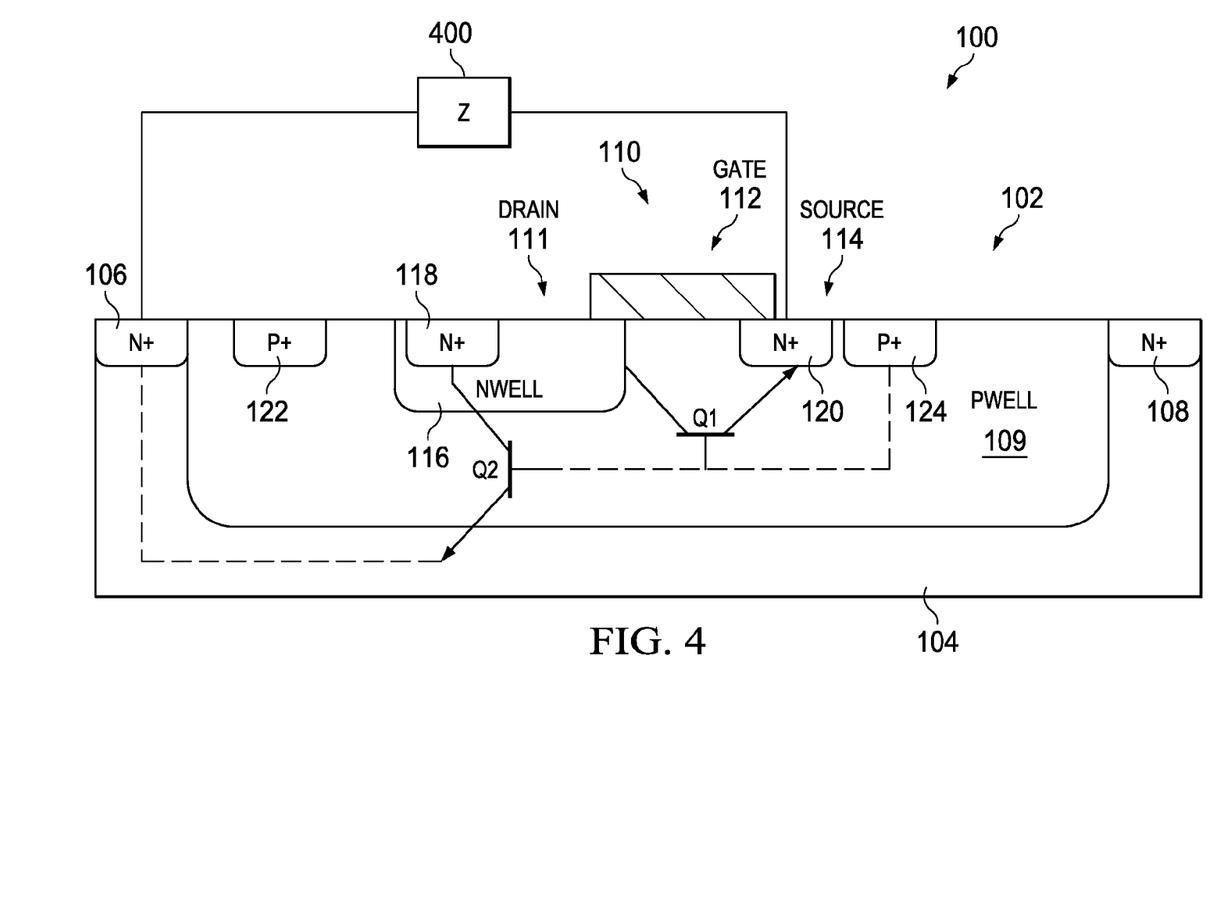
FIG. 4 is a cut away view of the isolated DEMOS device of FIG. 1 with an impedance coupled in series with the isolation.

FIG. 4 is a cut away view of the isolated device 100 with an impedance 400 coupled between the isolation 104 and the source 114. In some examples, the impedance is a series resistance or resistor. In some examples, the device 100 is a 20v isolated DEMOS and the impedance has a value of between 1 kΩ and 20 kΩ. In other examples, the impedance 400 is a transistor wherein the source or drain is coupled to the isolation 104 and the other of the source or drain is coupled to the source 114 of the semiconductor 102. The transistor is normally on, meaning that it is normally conducting with low source/drain resistance. The gate is coupled to ESD detection circuitry and changes potential in response to an ESD event. The change in gate potential increases the source/drain resistance, which prevents current flow into the isolation. The reduced current flow through the body 109 alleviates the effects of ESD events as described above. In some examples, the impedance is coupled between the isolation 104 and a ground.

Figure 5A:
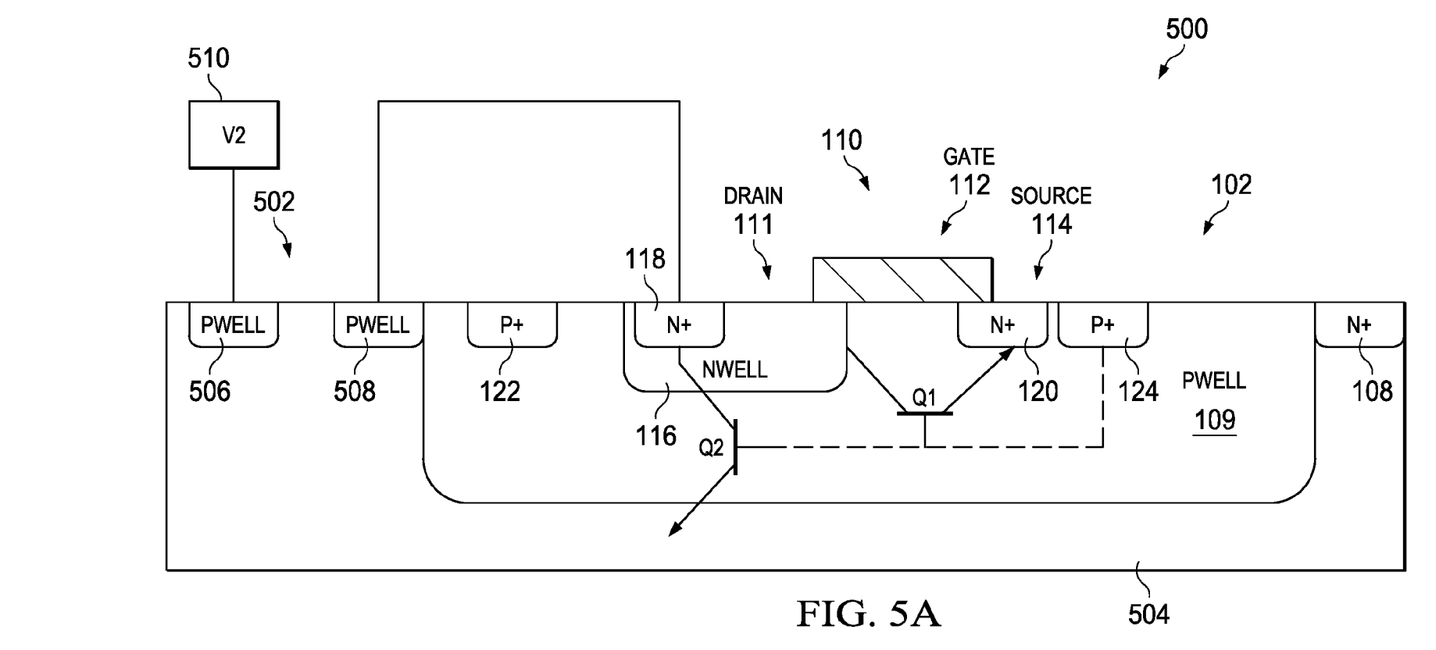
FIG. 5A is a cutaway view of an isolated DEMOS device with a transistor embedded in the isolation material.

FIG. 5A is a cutaway view of an isolated DEMOS device 500 with a transistor 502 embedded in the isolation material 504. The example of the transistor 502 of FIG. 5A is a PNP transistor. The device 500 provides a different biasing technique for the isolation 504. Two Pwell regions, referred to individually as the first Pwell region 506 and the second Pwell region 508 are embedded into the isolation material 504 in such a manner that the isolation material 504 serves as the base of the transistor 502. The first and second Pwell regions 508 and 508 serve as emitter/drain or collector/source of the transistor 502. The first Pwell region 506 is coupled to a voltage source 510 that provides a bias voltage V2 on the isolation material 504 during normal operation. The second Pwell region 508 is coupled to the contact region 118 of the drain 111.

The embedded transistor 502 in the isolation 504 biases the isolation 504 one diode voltage (PN junction voltage) below the drain 111 during ESD events. The transistor 502 is designed to sustain the maximum voltage potential between the drain 111 and the isolation 504 under normal operation of the device 500 when no ESD events are occurring. The transistor Q2 is less likely to latch up than transistors in conventional devices because the potential of the isolation 504 is always just one forward diode voltage below the voltage V2 of the voltage source 510.

Figure 5B:
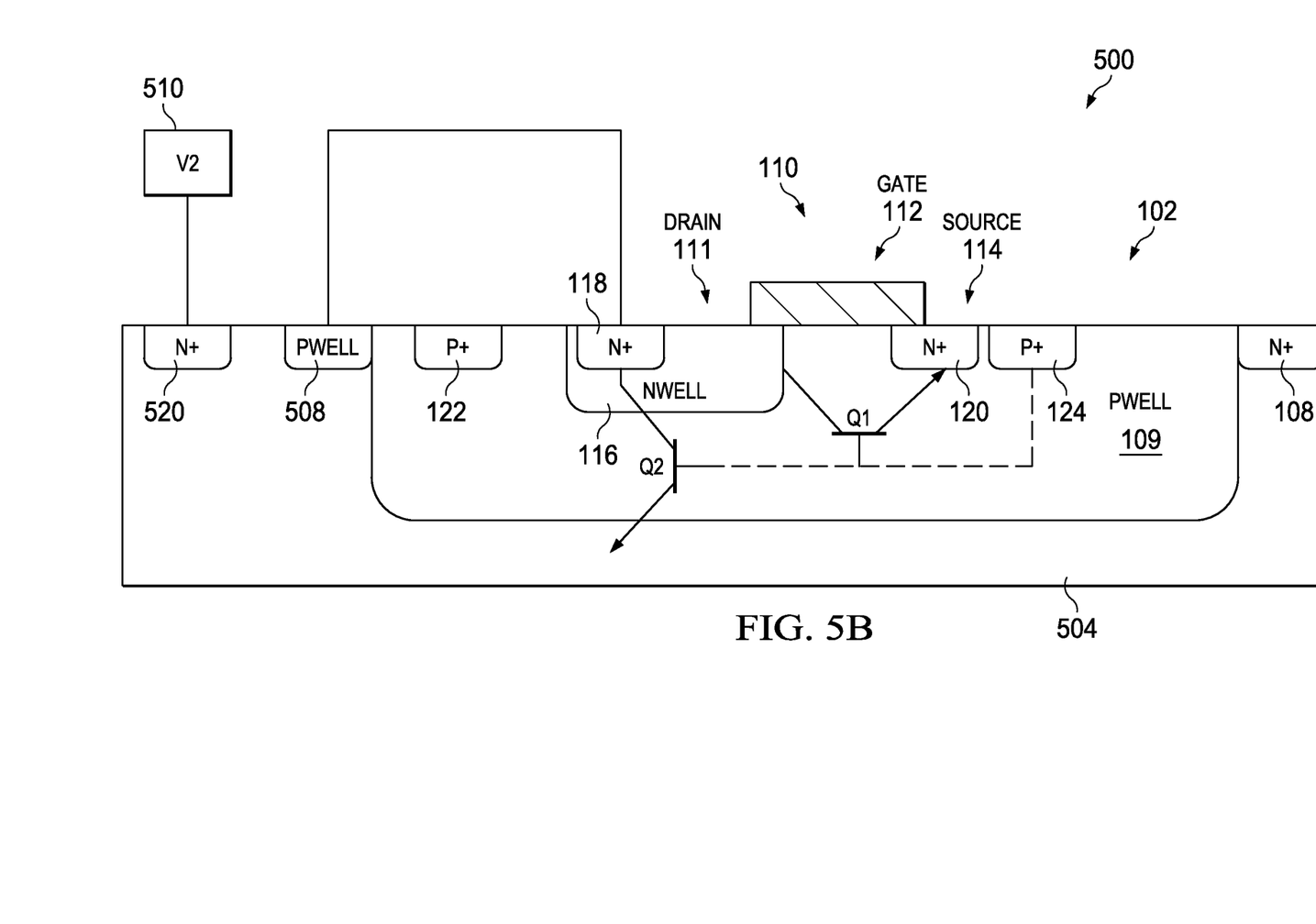
FIG. 5B is a cutaway view of an isolated DEMOS device with a transistor embedded in the isolation material.

FIG. 5B is an example of the device 100 where a PN junction is formed between the drain 111 and the isolation 504 instead of the PNP transistor 502 of FIG. 5B. The isolation 504 has an N+ region 520 that is coupled to the voltage source 510. The advantage of the PN junction of FIG. 5B is that the drain 111 can be at a higher potential as compared to the isolation 504. With just the PN junction of FIG. 5B, when the drain 111 is at a higher potential, the PN junction, or diode formed by the PN junction, is forward biased.

Figure 6A:
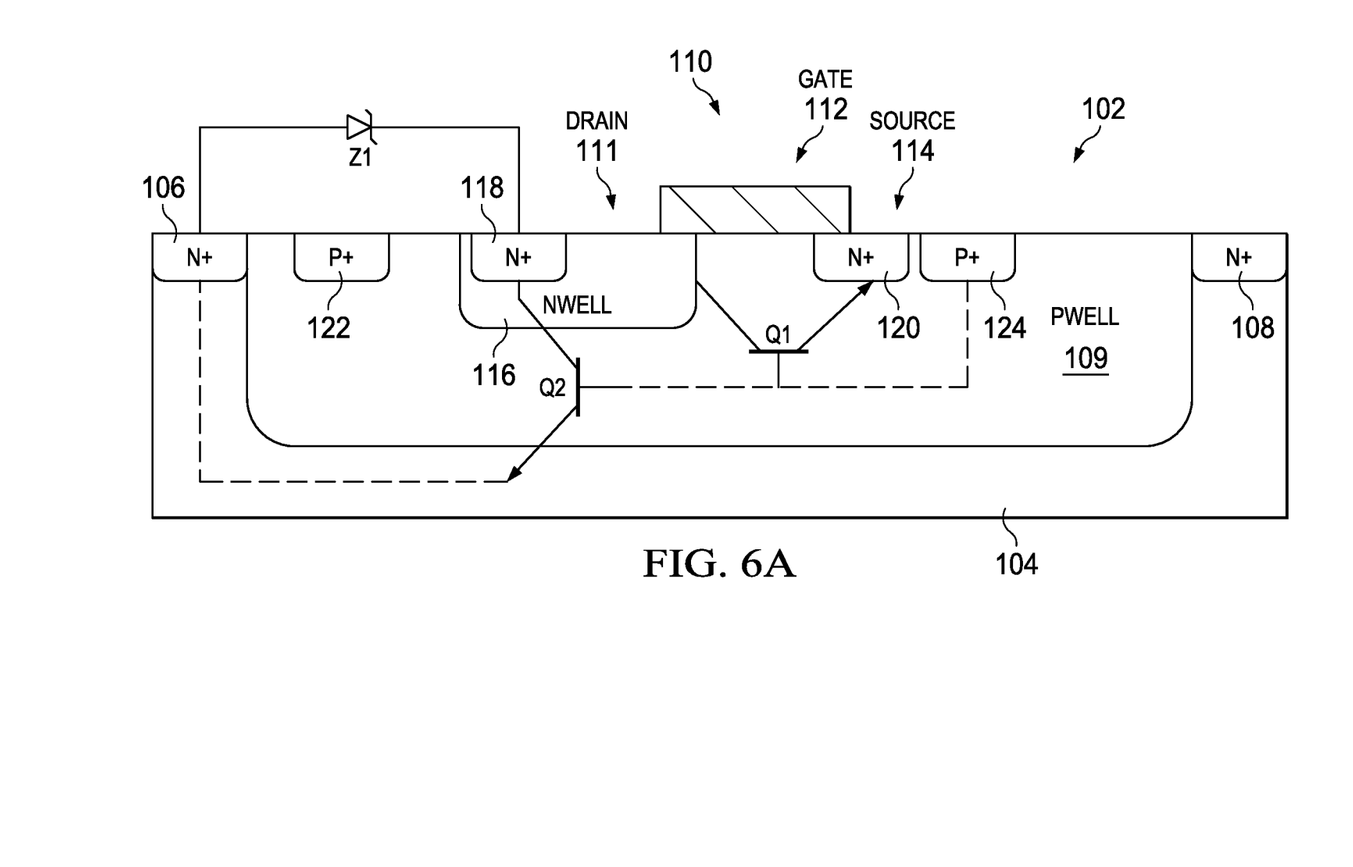
FIG. 6A is a cutaway view of an isolated DEMOS device with static coupling located between the isolation and the drain.
Figure 6B:
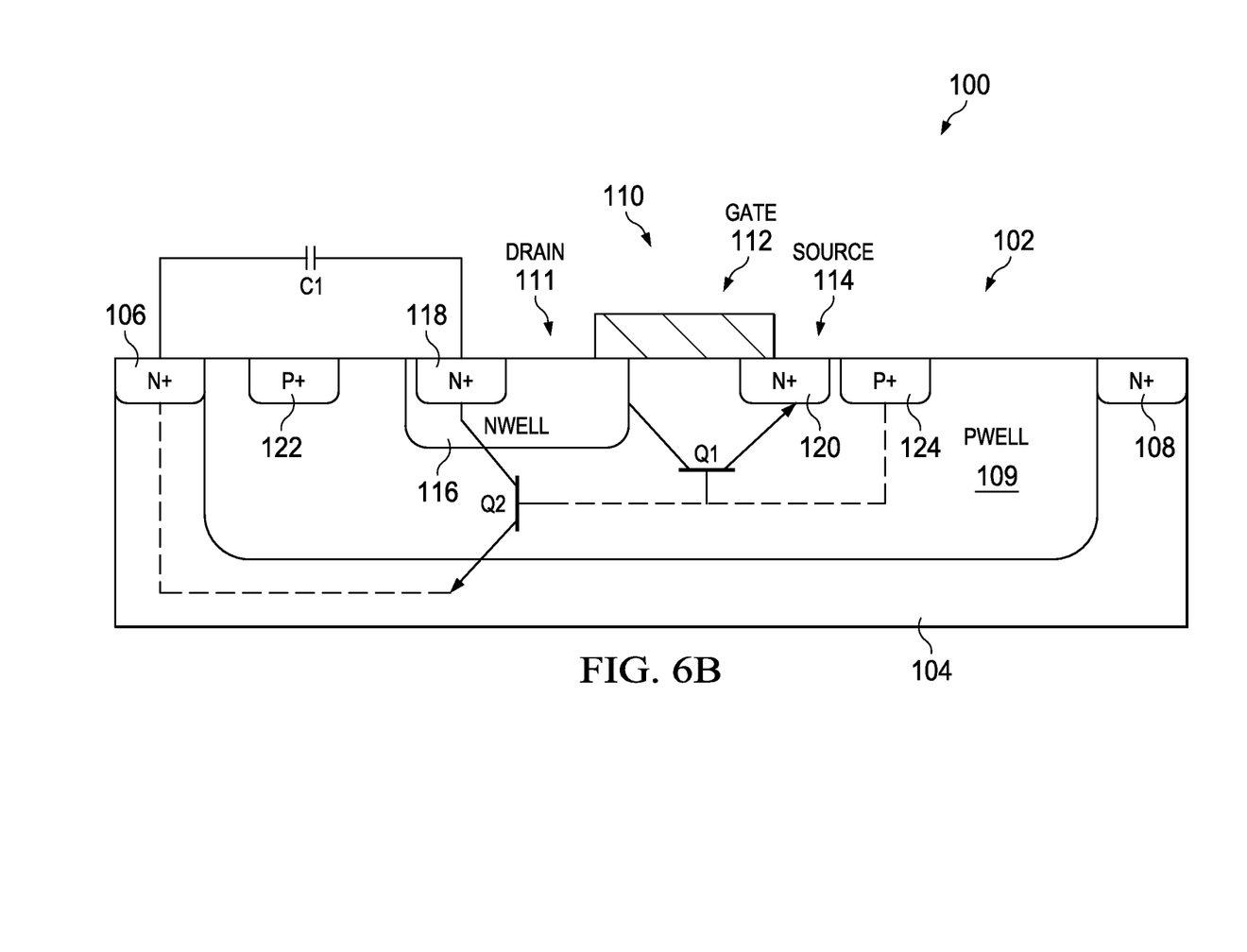
FIG. 6B is a cutaway view of an isolated DEMOS device with capacitive coupling located between the isolation and the drain.

FIG. 6A is a cutaway view of the device 100 with static coupling between the isolation 104 and the drain 111. The static coupling is achieved with a static coupling device coupled between the isolation 104 and the drain 111. In the example of FIG. 6A, the static coupling device is a zener diode Z1. Under normal operating conditions, the drain 111 has a potential that is the zener voltage of the zener diode Z1 greater than the potential of the isolation 104. Accordingly, the device 100 operates normally unless an ESD event occurs, at which time the zener diode Z1 breaks down and conducts to turn off the transistor Q2. A similar mechanism is provided by the example of FIG. 6B, which has a capacitor C1 in place of the zener diode Z1. The capacitor C1 provides a high impedance for normal operating frequencies of the device 100. An ESD event typically has frequencies that are higher than the normal operating frequencies of the device 100. Accordingly, a voltage spike associated with an ESD event increases the isolation potential thereby protecting the transistor Q2.

In some applications, scalability is desired. Scalability refers to the ability of the device to withstand or conduct more current as the size of the device increases. For example, as the size of the device increases, the breakdown current should increase proportionally. Devices that are not scalable typically have the same breakdown current irrespective of their size. Many of the examples described above provide scalability by increasing/changing the isolation potential during ESD events. The change in the isolation potential changes or increases the effective body resistance of the transistor Q1 and improves the uniformity of current conduction through the transistor Q1.

Figure 7:
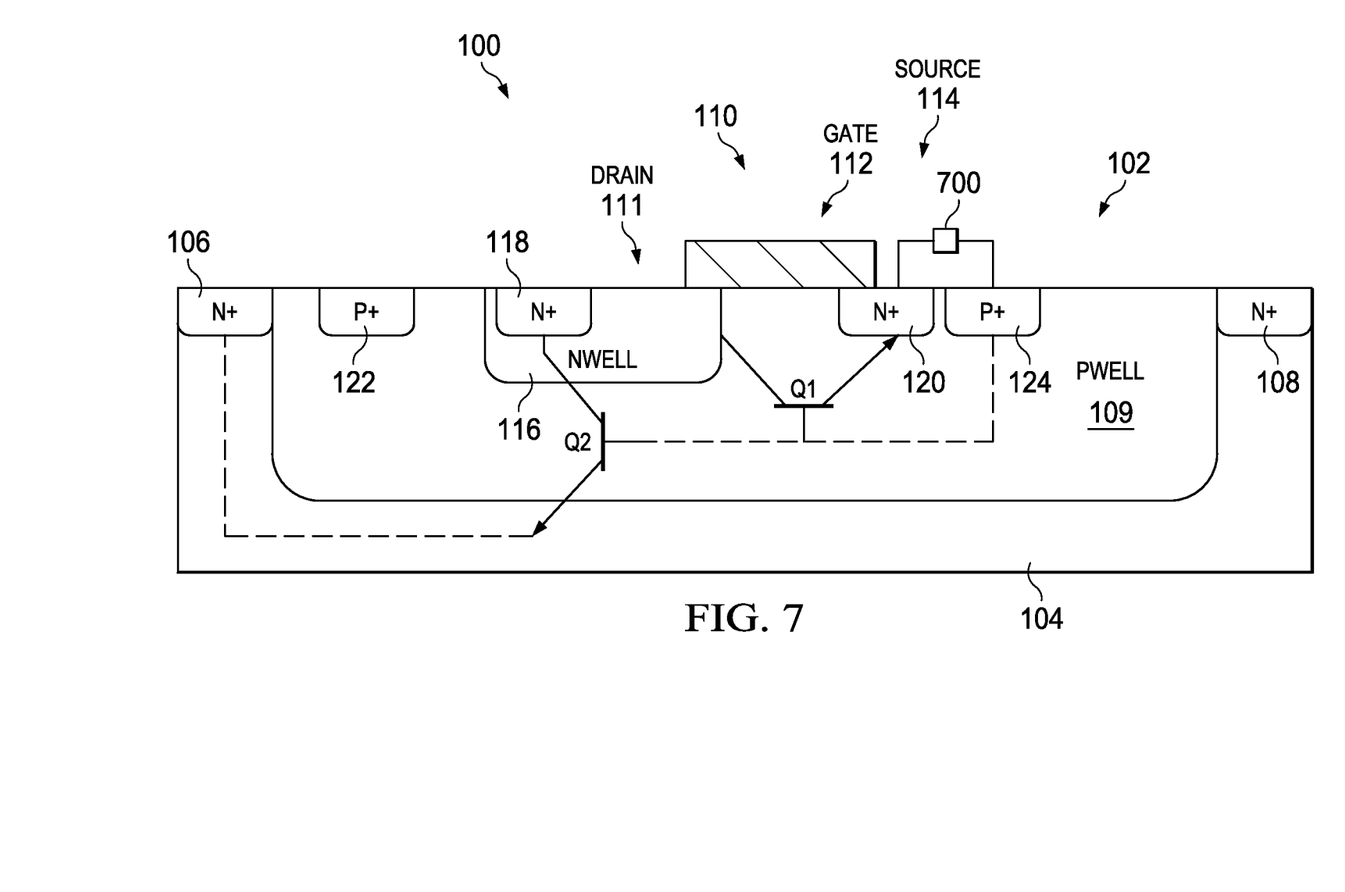
FIG. 7 is a cutaway view of an isolated DEMOS device with an impedance coupled between a source and a body contact.

Some MOS devices do not have the isolation 104, FIG. 1, of the device 100. In these devices and with devices that include isolation, scalability can be improved by increasing the body resistance of the transistor Q1. Reference is made to FIG. 7, which is an example of the device 100 that has an impedance 700 coupled between the source 114 and the body 109. In the example of FIG. 7, the impedance 700 is coupled between the contact region 120 of the source 114 and the contact region 124 of the body 109. In some embodiments, the impedance is a resistance or a resistor.

Figure 8:
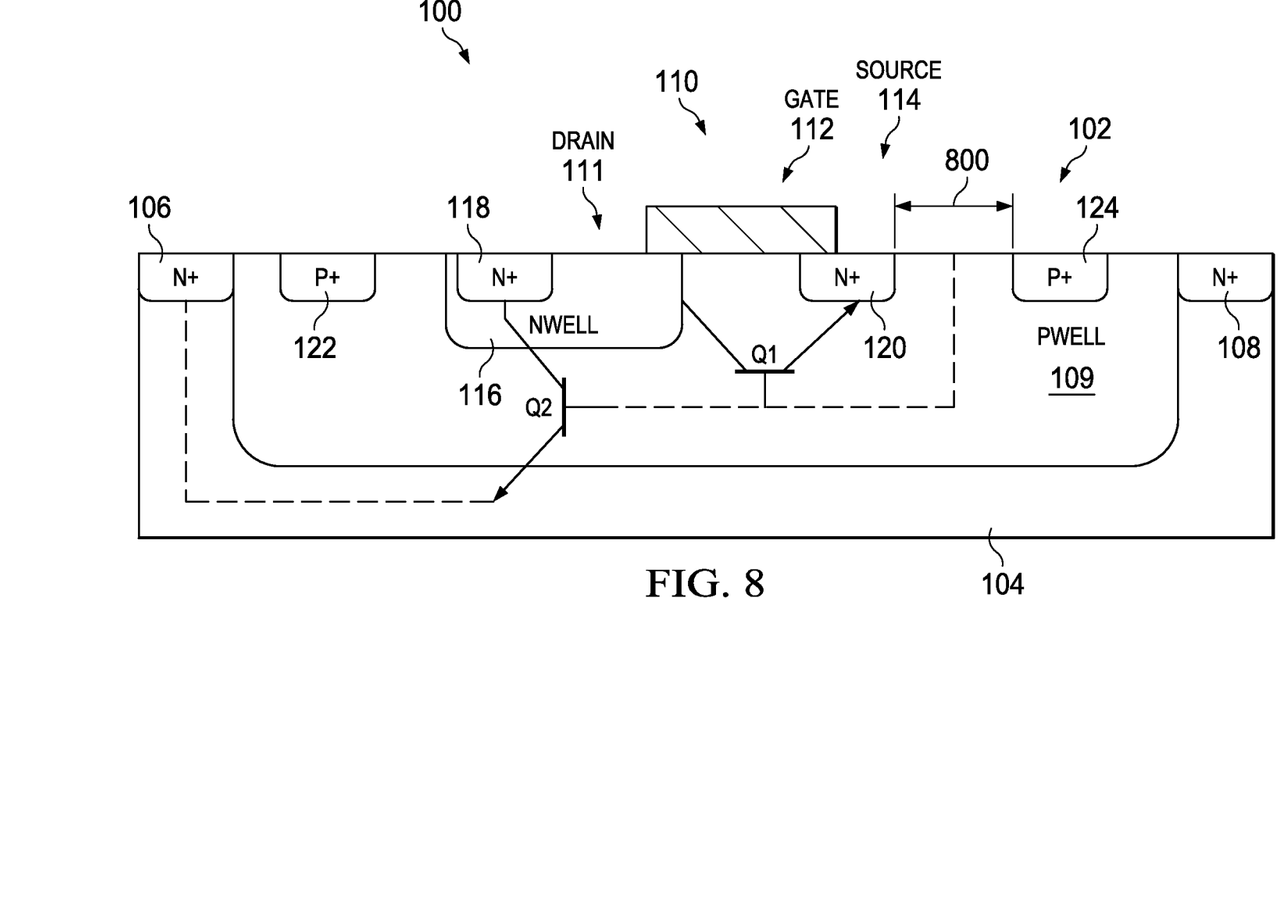
FIG. 8 is a cutaway view of a DEMOS device with an extended gap located between the source and a body contact.

FIG. 8 is another embodiment of the device 100 with an extended space 800 located between the source 114 and the contact region 124 of the body 109. In the example of FIG. 8, the extended space 800 is located between the contact region 120 of the source 114 and the contact region 124 of the body 109. The extended space 800 is a resistance through the body 109, which increases the resistance between the body 109 and the contact region 120 of the source 114.

While an illustrative and presently preferred embodiment of the disclosure have been described in detail herein, it is to be understood that the inventive concepts may be otherwise variously embodied and employed and that the appended claims are intended to be construed to include such variations except insofar as limited by the prior art.

What is claimed is:

1. A semiconductor device, comprising:
    a transistor having:
        a drain region;
        a body region laterally surrounding the drain region; and
        an isolation structure laterally surrounding the body region; and
    a switch coupled between the drain region and the isolation structure.

2. The semiconductor device of claim 1, further comprising:
    an electrostatic discharge (ESD) detection device coupled to the switch, the ESD detection device configured to generate an output signal upon detecting an ESD event, the output signal configured to close the switch coupled between the drain region and the isolation structure.

3. The semiconductor device of claim 1, further comprising:
    a drain bias terminal coupled to the drain region and the switch.

4. A method comprising:
    biasing an isolation structure by a first potential, the isolation structure laterally surrounding a body region of a transistor, and the body region laterally surrounding a drain region of the transistor;
    detecting an electrostatic discharge (ESD) event; and
    biasing the isolation structure by a second potential different from the first potential in response to detecting the ESD event.

5. The method of claim 4, further comprising:
    maintaining the isolation structure by the first potential in responses to an absence of the ESD event.

6. The method of claim 4, wherein the biasing the isolation structure by the second potential includes closing a switch to couple the isolation structure to the drain region biased by a voltage source.

* * * * *